(12) United States Patent
Zhang et al.

(10) Patent No.: US 12,439,605 B2
(45) Date of Patent: Oct. 7, 2025

(54) SEMICONDUCTOR DEVICE, THREE-DIMENSIONAL MEMORY AND METHOD FOR FABRICATING THE SEMICONDUCTOR DEVICE

(71) Applicant: YANGTZE MEMORY TECHNOLOGIES CO., LTD., Wuhan (CN)

(72) Inventors: Quan Zhang, Wuhan (CN); Lan Yao, Wuhan (CN); Jiaji Wu, Wuhan (CN); Beibei Zhu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 594 days.

(21) Appl. No.: 17/871,519

(22) Filed: Jul. 22, 2022

(65) Prior Publication Data
US 2023/0082694 A1 Mar. 16, 2023

Related U.S. Application Data

(63) Continuation of application No. PCT/CN2021/115851, filed on Sep. 10, 2021.

(51) Int. Cl.
*H10B 43/40* (2023.01)
*H10B 41/27* (2023.01)
(Continued)

(52) U.S. Cl.
CPC ............ *H10B 43/40* (2023.02); *H10B 41/27* (2023.02); *H10B 41/40* (2023.02); *H10B 43/27* (2023.02)

(58) Field of Classification Search
CPC ........ H10B 43/40; H10B 43/27; H10B 41/27; H10B 41/40; H10B 69/00; H10D 30/6211;
(Continued)

(56) References Cited

U.S. PATENT DOCUMENTS

| | | | |
|---|---|---|---|
| 5,949,126 A | * 9/1999 | Dawson | ............ H01L 21/76224 257/E21.546 |
| 2003/0022426 A1 | * 1/2003 | Kumamoto | .......... H10D 84/038 257/E21.507 |

(Continued)

FOREIGN PATENT DOCUMENTS

| KR | 20010065747 A | 7/2001 |
|---|---|---|
| KR | 20020042312 A | 7/2008 |

(Continued)

*Primary Examiner* — Shaun M Campbell
(74) *Attorney, Agent, or Firm* — BAYES PLLC

(57) ABSTRACT

The present disclosure discloses a semiconductor device, a three-dimensional memory and a method for fabricating the semiconductor device. The method includes forming a shallow trench isolation trench in a substrate. The substrate comprises an active region including a source region, a channel region, and a drain region. The shallow trench isolation trench is located on a periphery of the active region of the substrate. The method further comprises forming a bottom isolating layer in a bottom portion of the shallow trench isolation trench, forming a gate structure on a channel region of the substrate, and forming a hard insulating layer in an upper portion of the shallow trench isolation trench and on sidewalls of the active region, such that the hard insulating layer covers a source region and a drain region of the substrate.

17 Claims, 8 Drawing Sheets

(51) Int. Cl.
*H10B 41/40* (2023.01)
*H10B 43/27* (2023.01)

(58) Field of Classification Search
CPC .... H10D 30/024; H10D 30/60; H10D 30/027; H10D 30/637; H10D 64/018; H01L 21/76224
See application file for complete search history.

(56) References Cited

U.S. PATENT DOCUMENTS

| | | | |
|---|---|---|---|
| 2005/0280052 A1 | 12/2005 | Holz et al. | |
| 2007/0020862 A1* | 1/2007 | Ha | H01L 21/76224 |
| | | | 257/E21.546 |
| 2008/0272394 A1* | 11/2008 | Kapoor | H10D 30/0512 |
| | | | 257/190 |
| 2009/0101968 A1* | 4/2009 | Sugioka | H10D 30/024 |
| | | | 257/E47.001 |
| 2017/0200823 A1 | 7/2017 | Kang et al. | |
| 2017/0330887 A1* | 11/2017 | Kim | H10B 43/27 |
| 2019/0378846 A1* | 12/2019 | Liu | H01L 23/5256 |
| 2020/0105593 A1* | 4/2020 | Wu | H01L 21/76843 |
| 2021/0351272 A1* | 11/2021 | Lu | H10D 62/116 |

FOREIGN PATENT DOCUMENTS

| | | |
|---|---|---|
| KR | 20080061435 A | 7/2008 |
| KR | 20090069058 A | 6/2009 |

\* cited by examiner

```
┌─────────────────────────────────────────────────────────────────┐
│ forming a shallow trench isolation trench in a substrate, wherein the substrate │  101
│ comprises an active region, the shallow trench isolation trench is on           │
│ periphery of the active region, and the active region comprises a source        │
│ region, a channel region and a drain region that are sequentially connected     │
└─────────────────────────────────────────────────────────────────┘
                                    │
                                    ▼
┌─────────────────────────────────────────────────────────────────┐
│ forming a bottom isolating layer in the shallow trench isolation trench │  102
└─────────────────────────────────────────────────────────────────┘
                                    │
                                    ▼
┌─────────────────────────────────────────────────────────────────┐
│                forming a gate structure on the channel region           │  103
└─────────────────────────────────────────────────────────────────┘
                                    │
                                    ▼
┌─────────────────────────────────────────────────────────────────┐
│ forming a hard insulating layer on sidewalls of the active region, such that │  104
│ the hard insulating layer covers the source region and the drain region      │
└─────────────────────────────────────────────────────────────────┘
```

Fig. 1

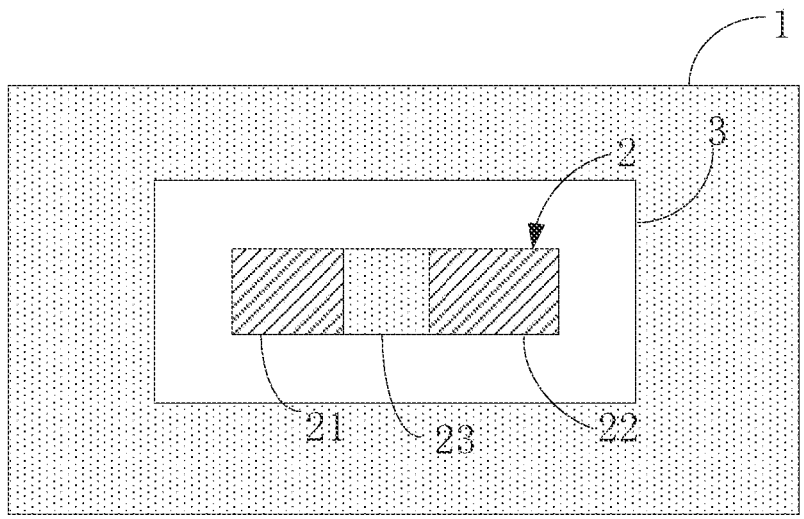

Fig. 2a

SEMICONDUCTOR DEVICE, THREE-DIMENSIONAL MEMORY AND METHOD FOR FABRICATING THE SEMICONDUCTOR DEVICE

CROSS-REFERENCE TO RELATED APPLICATIONS

This application is continuation of International Application No. PCT/CN2021/115851, filed on Sep. 10, 2021, entitled "SEMICONDUCTOR DEVICE, THREE-DIMENSIONAL MEMORY AND METHOD FOR FABRICATING THE SEMICONDUCTOR DEVICE," which is hereby incorporated by reference in its entirety.

TECHNICAL FIELD

The present disclosure relates to the field of semiconductor technologies, and more particularly to a semiconductor device, a three-dimensional memory and a method for fabricating the semiconductor device.

BACKGROUND

In a semiconductor device, the area of the source and drain region of the transistor (in particular low-voltage transistor) in the peripheral structure (CMOS) is small, so that the landing window between the source and drain region and the contact structure (CT) is small. However, since the source/drain region is disposed adjacent to a shallow trench isolation structure, if the landing position of the contact structure is somewhat misaligned with the source/drain region, for example, the contact structure is partially on the source/drain region and partially on the shallow trench isolation structure, the contact structure is prone to collapse due to the material of the shallow trench isolation structure as an oxide, affecting the performance of the semiconductor device.

SUMMARY

The present disclosure provides a semiconductor device, a three-dimensional memory and a method for fabricating the semiconductor device, which can enlarge landing window for the source and drain region and improve performance of the semiconductor device.

The disclosure provides a method for fabricating a semiconductor device, comprising:
  forming a shallow trench isolation trench in a substrate, wherein the substrate comprises an active region, the shallow trench isolation trench is on periphery of the active region, and the active region comprises a source region, a channel region and a drain region that are sequentially connected;
  forming a bottom isolating layer in the shallow trench isolation trench;
  forming a gate structure on the channel region;
  forming a hard insulating layer on sidewalls of the active region, such that the hard insulating layer covers the source region and the drain region.

More preferably, the step of forming the bottom isolating layer in the shallow trench isolation trench comprises:
  filling a dielectric layer in the shallow trench isolation trench;
  etching the dielectric layer, such that the etched dielectric layer forms the bottom isolating layer.

More preferably, the step of forming the gate structure on the channel region comprises:
  forming a gate insulating layer on an inner surface of the shallow trench isolation trench and on the substrate;
  forming a gate layer on the gate insulating layer;
  etching the gate insulating layer and the gate layer, such that the etched gate insulating layer and the etched gate layer form the gate structure on the channel region.

More preferably, the method further comprises:
  extending the hard insulating layer onto the bottom isolating layer, the source region, the drain region and the gate structure.

More preferably, before the step of forming the hard insulating layer on the sidewalls of the active region, the method further comprises:
  forming spacers on sidewalls of the shallow trench isolation trench and sidewalls of the gate structure.

More preferably, before the step of forming the hard insulating layer on the sidewalls of the active region, the method further comprises:
  forming an ohmic contact layer on the source region, the drain region and the gate structure.

More preferably, the method further comprises:
  forming a first contact structure connected with the source region and a second contact structure connected with the drain region.

The disclosure also provides a semiconductor device, including:
  an active region comprising a source region, a channel region and a drain region that are sequentially connected;
  a bottom isolating layer on periphery of the active region;
  a gate structure on the channel region; and
  a hard insulating layer on sidewalls of the active region, the hard insulating layer covering the source region and the drain region.

More preferably, the gate structure comprises a gate insulating layer and a gate layer on the gate insulating layer.

More preferably, the hard insulating layer is also located on the bottom isolating layer, the source region, the drain region and the gate structure.

More preferably, the semiconductor device further comprises:
  an ohmic contact layer located between the source region and the hard insulating layer, between the drain region and the hard insulating layer, and between the gate structure and the hard insulating layer.

More preferably, the semiconductor device further comprises:
  spacers located between the hard insulating layer and the sidewalls of the active region and on sidewalls of the gate structure.

More preferably, the semiconductor device further comprises:
  a first contact structure connected with the source region and a second contact structure connected with the drain region.

More preferably, the gate structure further extends onto the bottom isolating layer along the sidewalls of the active region.

The present disclosure also provides a three-dimensional memory including a memory array structure and a peripheral structure connected with the memory array structure, wherein the peripheral structure includes a semiconductor device;

the semiconductor device comprising:
  an active region comprising a source region, a channel region and a drain region that are sequentially connected;
  a bottom isolating layer on periphery of the active region;
  a gate structure on the channel region; and
  a hard insulating layer on sidewalls of the active region, the hard insulating layer covering the source region and the drain region.

More preferably, the hard insulating layer is also located on the bottom isolating layer, the source region, the drain region and the gate structure.

More preferably, the semiconductor device further comprises:
  an ohmic contact layer located between the source region and the hard insulating layer, between the drain region and the hard insulating layer, and between the gate structure and the hard insulating layer.

More preferably, the semiconductor device further comprises:
  spacers located between the hard insulating layer and the sidewalls of the active region and on sidewalls of the gate structure.

More preferably, the semiconductor device further comprises:
  a first contact structure connected with the source region and a second contact structure connected with the drain region.

More preferably, the gate structure further extends onto the bottom isolating layer along the sidewalls of the active region.

As beneficial effects of the present disclosure, the shallow trench isolation trench is first formed in the substrate, the bottom isolating layer is formed in the shallow trench isolation trench, then the gate structure is formed such that the gate structure is on the channel region between the source region and the drain region in the substrate, and then the hard insulating layer is formed on the sidewalls of the active region such that the hard insulating layer covers the source region and the drain region; as a result, subsequently in forming the contact structure, even though the contact structure is partially on the source/drain region and partially on the hard insulating layer, the contact structure will not collapse, so that the landing window for the source region and the drain region is enlarged and the performance of the semiconductor device is improved.

BRIEF DESCRIPTION OF THE DRAWINGS

In order to illustrate technical solutions in embodiments more clearly, drawings needed in the description of the embodiments will be briefly introduced. Apparently, drawings in the following description are only some embodiments of the disclosure and, in view of them, other drawings can be figured out by those of ordinary skills in the art without any creative works.

FIG. 1 is a flowchart of a method for fabricating a semiconductor device provided by an embodiment of the present disclosure;

FIGS. 2a-2j are structural diagrams of a method for fabricating a semiconductor device provided by an embodiment of the present disclosure;

DETAILED DESCRIPTION

Figure 2B:
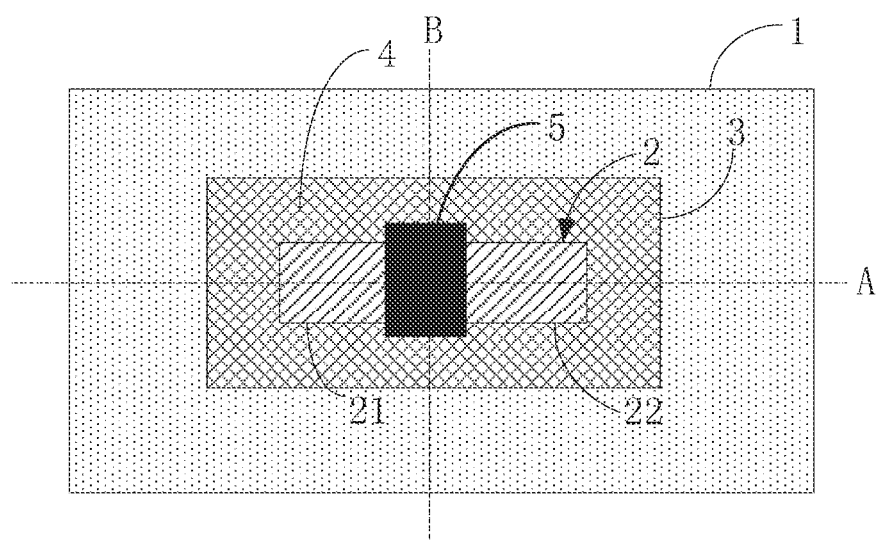

Specific details of structures and functions disclosed herein are only representative and used for the purpose of describing exemplary embodiments of the present disclosure. However, the present disclosure may be embodied in many alternative forms and should not be construed as limited to only the embodiments set forth herein.

In the description of the present disclosure, it is understood that the orientations and position relationships indicated by terms "center", "lateral direction", "upper", "lower", "left", "right", "vertical", "horizontal", "top", "bottom", "inner" and "outer" etc. are the orientations and position relationships indicated based on the drawings and only for the convenience of describing the present disclosure and simplifying the description, rather than indicating or implying that the apparatuses or elements referred to must have particular orientations, or be constructed or operated in particular orientations. As a result, they should not be understood as limitation for the present disclosure. Moreover, terms "first", "second" are only used for the purpose of description and should not be understood to indicate or imply relative importance or designate implicitly the number of the technical features indicated. Therefore, a feature defined as "first" or "second" may include explicitly or implicitly one or more of the features. In the description of the present disclosure, "a plurality of" means two or more unless otherwise stated. Moreover, the term "include", "comprise" and variations thereof are intended to cover the meaning of "include or comprise non-exclusively".

In the description of the present disclosure, it is to be noted that terms "mounted", "interconnected" and "connected", unless otherwise specified or defined expressly, should be explained broadly, and may be for example, fixed connection, removable connection or integral connection; they may be mechanical connection or electrical connection; they may be direct interconnection or interconnection with intermediate medium; they may be inner communication between two elements. The specific meanings of the above-mentioned terms in the present disclosure can be understood by those of ordinary skills in the art depending on specific circumstances.

Terms used herein are only for the purpose of describing specific embodiments and are not intended to limit exemplary embodiments. Singular forms "a" and "an" used herein are also intended to include plural forms, unless otherwise noted expressly in the context. It is also understood that terms "include" and/or "comprise" used herein specify existence of the stated features, integers, steps, operations, elements and/or assemblies without excluding existence or addition of one or more other features, integers, steps, operations, elements, assemblies and/or any combination thereof.

Referring to FIG. 1, which is a flowchart of a method for fabricating a semiconductor device provided by an embodiment of the present disclosure.

As shown in FIG. 1, the present embodiment provides a method for fabricating a semiconductor device, the method including the following steps 101-104.

In step 101, an shallow trench isolation trench is formed in a substrate. The substrate includes an active region that includes a source region, a channel region and a drain region that are sequentially connected, and the shallow trench isolation trench is on a periphery of the active region.

In the embodiment of the present disclosure, a substrate is first provided. The substrate may be a silicon substrate, a germanium substrate or a semiconductor substrate including other elements. The substrate may be doped with an amount of trivalent elements, such as boron, indium, gallium, aluminum or the like, to form a P-type semiconductor substrate. The substrate may also be doped with an amount of pentavalent elements, such as phosphorous, antimony, arsenic, or the like, to form an N-type semiconductor substrate. An active region may also be formed in the substrate, the active region being close to the upper surface of the substrate. By implanting P-type or N-type dopant into the active region through ion implantation (IMP), a P-type or N-type active region can be formed in the substrate.

Then, through ion implantation, specific regions in the active region of the substrate may be doped to form a source region and a drain region in the active region of the substrate, the source region and the drain region being close to the upper surface of the substrate and being spaced apart from each other, the active region between the source region and the drain region being a channel region, i.e., the source region, the channel region and the drain region being connected sequentially. A P-type doped region or an N-type doped region may be formed by implanting P-type dopant or N-type dopant into the source region and the drain region. The doping types of the source region and the drain region are the same. If the semiconductor device to be formed is an N-type transistor, N-type dopant can be implanted into the source region and the drain region; if the semiconductor device to be formed is a P-type transistor, P-type dopant can be implanted into the source region and the drain region.

Through ion implantation, specific regions in the active region of the substrate may also be doped to form a first doped region and a second doped region in the active region of the substrate, the first doped region and the second doped region being close to the upper surface of the substrate. The first doped region and the second doped region are spaced apart from each other, the first doped region being on the side of the source region away from the drain region and the second doped region being on the side of the drain region away from the source region. A P-type doped region or an N-type doped region may be formed by implanting P-type dopant or N-type dopant into the first doped region and the second doped region. The doping types of the first doped region and the second doped region are the same. The first doped region and the second doped region are used to lead out the active region, so that external bias voltages are applied on the active region to provide the transistor with different base bias voltages.

As shown in FIG. 2a, a substrate 1 includes an active region 2, which includes a source region 21, a channel region 23 and a drain region 22 that are sequentially connected. A shallow trench isolation trench 3 is formed on a periphery of the active region 2 of the substrate 1. That is, the shallow trench isolation trench 3 surrounds the active region 2.

In step S102, a bottom isolating layer is formed in the shallow trench isolation trench.

In the embodiment of the present disclosure, the bottom isolating layer may be formed directly on the bottom of the shallow trench isolation trench by spin coating, or may be formed by filling a dielectric layer in the shallow trench isolation trench and then partially etching the dielectric layer.

Figure 2C:
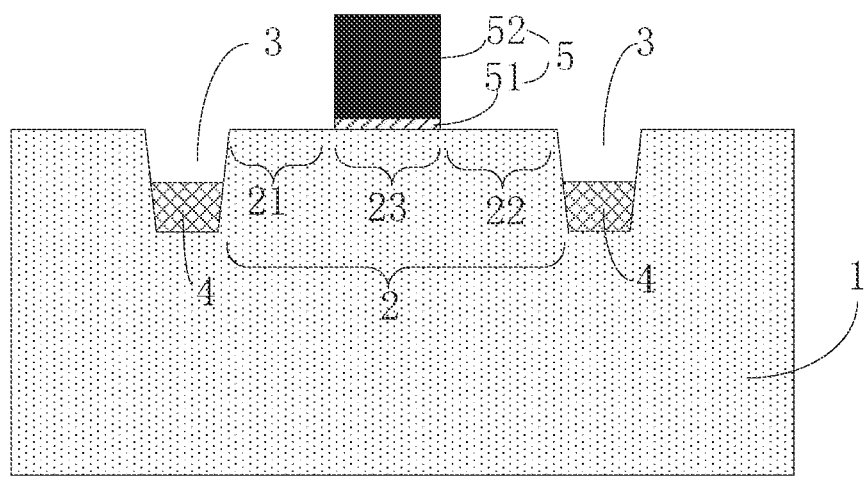

Specifically, forming the bottom isolating layer in the shallow trench isolation trench in step S102 includes:
   filling a dielectric layer in the shallow trench isolation trench; and
   partially etching the dielectric layer, such that a remaining portion of the dielectric layer forms the bottom isolating layer.

Wherein the shallow trench isolation trench is filled up with the dielectric layer and then the dielectric layer is partially etched, so that a remaining portion of the dielectric layer forms the bottom isolating layer. As shown in FIG. 2b, a bottom isolating layer 4 is formed in the shallow trench isolation trench 3. With reference to FIG. 2c, which is a cross-sectional diagram taken along the dashed line A in FIG. 2b, the bottom isolating layer 4 is at the bottom of the shallow trench isolation trench 3.

In step 103, a gate structure is formed on the channel region.

In the embodiment of the present disclosure, the gate structure is formed on the channel region between the source region and the drain region to form a transistor together with the source region and the drain region in the active region. The active region may be a low-low-voltage active region, a low-voltage active region, or a high-voltage active region. The transistor corresponding to a low-low-voltage active region is a low-low-voltage transistor; the transistor corresponding to a low-voltage active region is a low-voltage transistor; and the transistor corresponding to a high-voltage active region is a high-voltage transistor. Wherein "low-low-voltage", "low-voltage" and "high-voltage" are relative concepts. A low-low-voltage transistor has a relatively low operating voltage (i.e. the voltage applied on the gate layer of the gate structure), for example, between about 0V and about 5V; a high-voltage transistor has a relatively high operating voltage, for example, between about 15V and about 25V; and a low-voltage transistor has an operating voltage between those of a low-low-voltage transistor and a high-voltage transistor, for example, between about 5V and about 15V. With respect to a low-low-voltage transistor, a low-voltage transistor, and a high-voltage transistor, the high-voltage active region is the relatively biggest, the low-low-voltage active region is the relatively smallest, and the low-voltage active region has a size between those of the high-voltage active region and the low-low-voltage active region; a depth of the channel of the high-voltage transistor is the relatively deepest, a depth of the channel of the low-low-voltage transistor is the relatively shallowest, and the channel of the low-voltage transistor has a depth between those of the high-voltage active region and the low-low-voltage active region.

Transistors in this embodiment may be applied to the peripheral structure in a three-dimensional memory, wherein the peripheral structure may include page buffer circuits, IO circuits, WL driver circuits and the like. The page buffer circuits may include the above-mentioned high-voltage transistors, the IO circuits may include the above-mentioned low-voltage transistors, and the WL driver circuits may include the above-mentioned low-low-voltage transistors.

In some implementations, the gate structure is on the channel region and extends along sidewalls of the active region in order to reduce the footprint of the transistor and in turn the footprint of the semiconductor device.

Specifically, forming the gate structure on the channel region in step S103 includes:
   forming a gate insulating layer on an inner surface of the shallow trench isolation trench and on the substrate;
   forming a gate layer on the gate insulating layer; and etching the gate insulating layer and the gate layer, such that the etched gate insulating layer and the etched gate layer form the gate structure on the channel region.

Figure 2D:
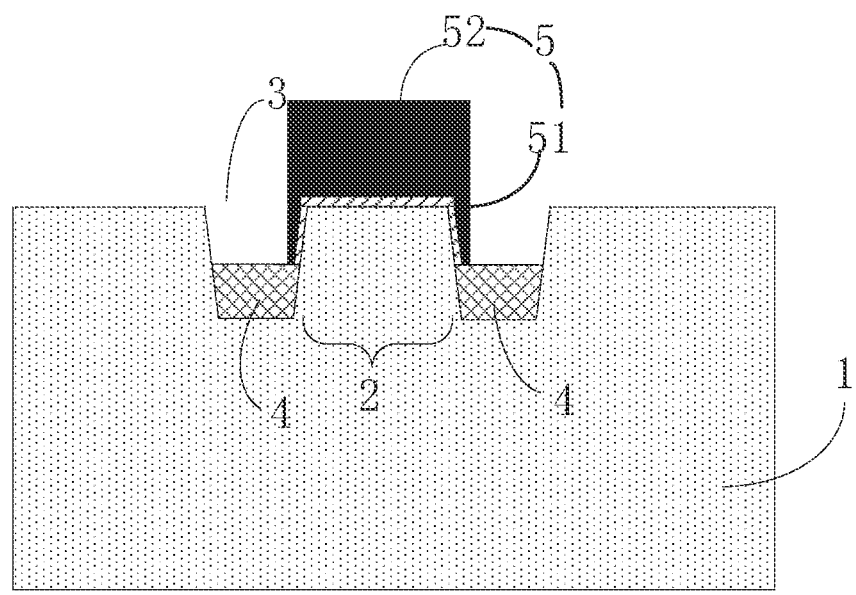

Referring to FIG. 2c which is a cross-sectional diagram taken along the dashed line A in FIG. 2b, and referring to FIG. 2d which is a cross-sectional diagram taken along the dashed line B in FIG. 2b, a gate insulating layer 51 with a relatively small thickness is first formed on the inner surface of the shallow trench isolation trench 3 and on the substrate 1. Then, a gate layer 52 is formed on the gate insulating layer 51 and filled in the shallow trench isolation trench 3. Then, the gate insulating layer 51 and the gate layer 52 are partially etched to forms a gate structure 5 that includes the remaining portions of the gate insulating layer 51 and the gate layer 52. The gate structure 5 is on the channel region 23 between the source region 21 and the drain region 22. The gate structure 5 may further extend to the bottom isolating layer 4 along the sidewalls of the active region 2. The sidewalls of the active region 2 covered by the gate structure 5 is the sidewalls between the source region 21 and the drain region 22, as shown in FIGS. 2b and 2d. Wherein the gate insulating layer 51 is between the active region 2 and the gate layer 52 and used to isolate the active region 2 from the gate layer 52.

In step 104, a hard insulating layer is formed on the sidewalls of the active region such that the hard insulating layer covers the source region and the drain region.

In the embodiment of the present disclosure, portions of the sidewalls of the active region are covered by the gate structure, and the hard insulating layer may be formed on the portions of the sidewalls of the active region that are not covered by the gate structure, so that the hard insulating layer at least covers the source region and the drain region. Wherein the hard insulating layer and the hard mask layer may be made of the same material. For example, the hard insulating layer may be made of silicon nitride (SiN).

Subsequently in forming the contact structure on the source region and the drain region, even though the contact structure is partially on the source/drain region and partially on the hard insulating layer, the contact structure will not collapse, so that the landing window for the source region and the drain region is enlarged and the performance of the semiconductor device is improved.

Furthermore, before the step of forming the hard insulating layer on the sidewalls of the active region, the method further includes:

forming spacers on sidewalls of the shallow trench isolation trench and sidewalls of the gate structure.

Figure 2E:
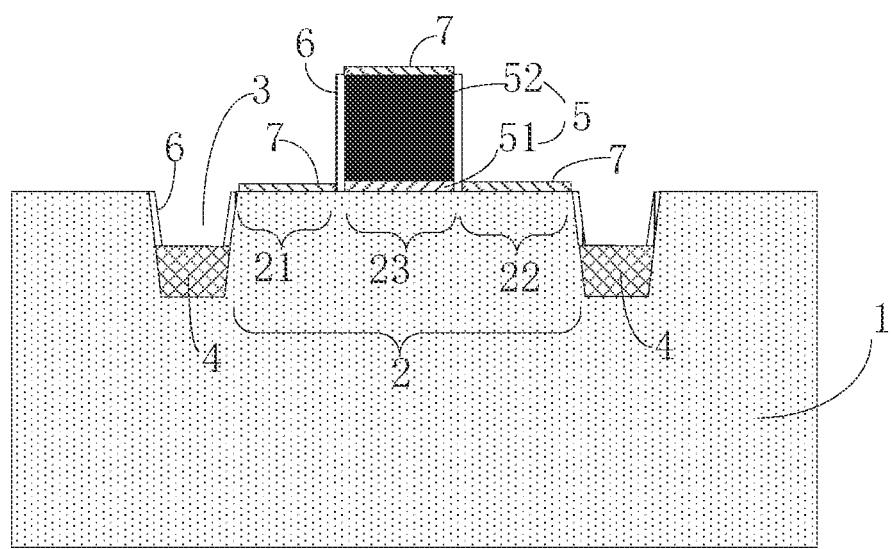

Based on FIG. 2c and as shown in FIG. 2e, spacers are first formed on the inner surface of the shallow trench isolation trench 3 (including the sidewalls and the bottom surface of the trench) and the outer surface of the gate structure 5 (including the sidewalls and the upper surface) and on the substrate 1, and then the spacers 6 are partially etched, such that the remaining portions of the spacers 6 are on the sidewalls of the shallow trench isolation trench 3 and the sidewalls of the gate structure 5. Wherein the spacers 6 may be an ONO (silicon oxide-silicon nitride-silicon oxide) structure (not shown in the figures), i.e., the spacers 6 may include a silicon oxide layer on the sidewalls of the shallow trench isolation trench 3 and the sidewalls of the gate structure 5, a silicon nitride layer on the surface of the silicon oxide layer, and another silicon oxide layer on the surface of the silicon nitride layer. The spacers 6 are used to protect the active region 2 and the gate structure 5.

Furthermore, before the step of forming the hard insulating layer on the sidewalls of the active region, the method further includes:

forming an ohmic contact layer on the source region, the drain region, and the gate structure.

As shown in FIG. 2e, after forming the spacers 6 on the sidewalls of the shallow trench isolation trench 3 and the sidewalls of the gate structure 5, an ohmic contact layer 7 is formed on the upper surface of the source region 21, the upper surface of the drain region 22, and the upper surface of the gate structure 5. The ohmic contact layer 7 is used to reduce contact resistance of the source region 21, the drain region 22, and the gate structure 5 with corresponding contact structures. The ohmic contact layer 7 forms ohmic contacts with the source region 21, the drain region 22, and the gate structure 5, so that the voltage drops at the positions of the contacts will be small enough to reduce the influences on the electrical performance of the device when the source region 21, the drain region 22, and the gate structure 5 are applied with voltages. Wherein the ohmic contact layer 7 may be made of nickel silicide (NiSi).

Figure 2F:
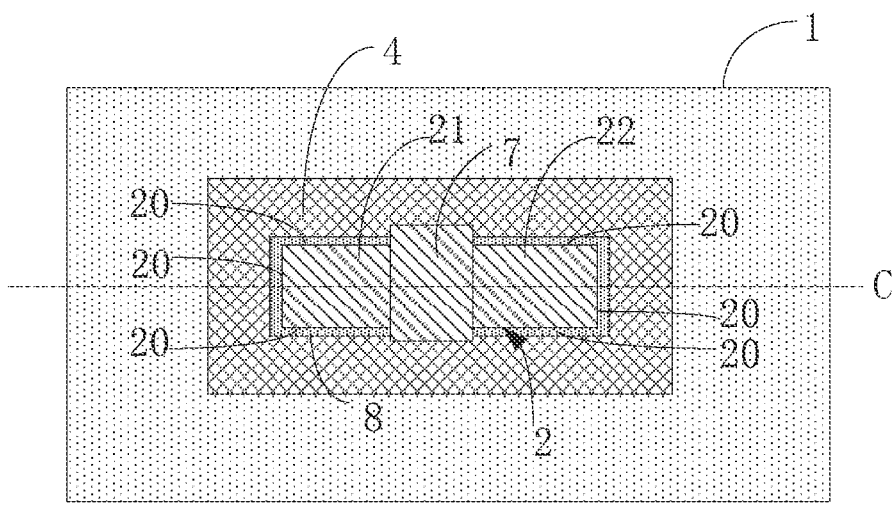

After forming the ohmic contact layer 7, a hard insulating layer 8 may be formed on the sidewalls 20 of the active region 2 such that the hard insulating layer 8 at least covers the source region 21 and the drain region 22, as shown in FIG. 2f. Since the source region 21 and the drain region 22 are spaced apart in the active region 2 and are located on two opposite ends of the active region 2, portions of the sidewalls (i.e. the sidewalls 20) of the active region 2 are the sidewalls of the source region 21 and the drain region 22. The hard insulating layer 8 is at least over the sidewalls 20 of the active region 2 such that the hard insulating layer 8 covers the source region 21 and drain region 22 on the sidewalls of the active region 2. When the spacers 6 are on the sidewalls of the active region 2, the hard insulating layer 8 is formed on the surfaces of the spacers 6.

Figure 2G:
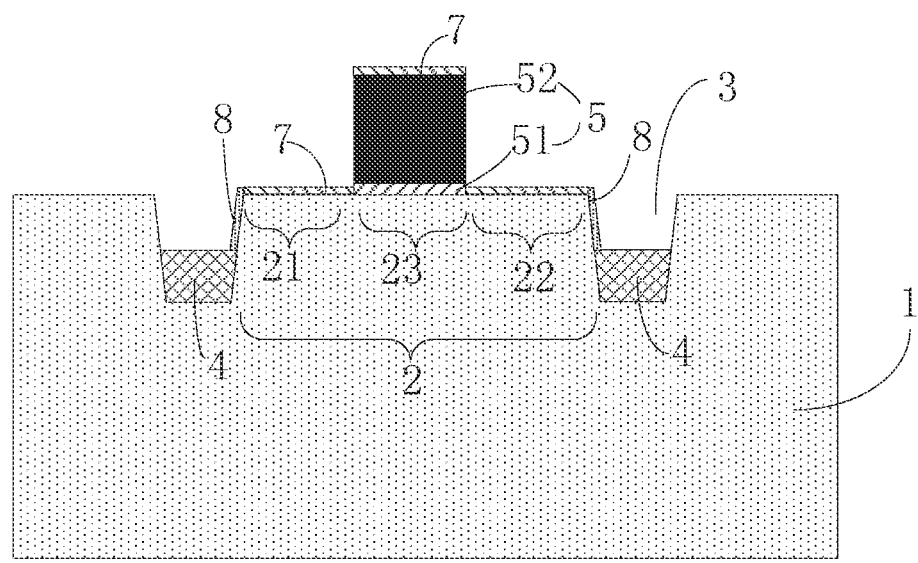
Figure 2H:
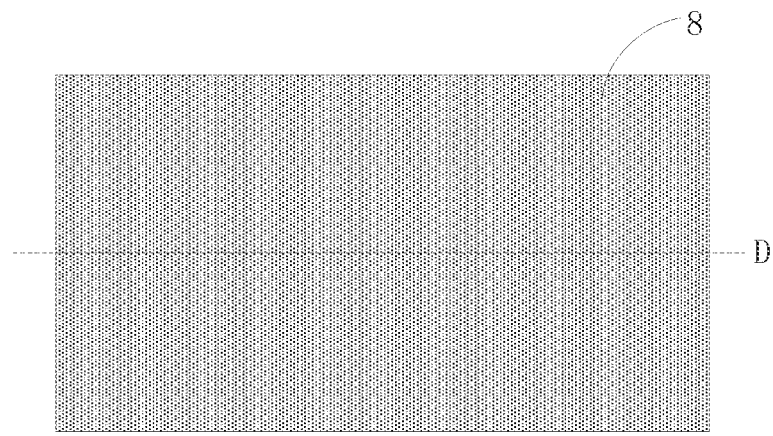

In one implementation, the hard insulating layer 8 may cover the source region 21 and the drain region 22 only on the sidewalls 20 of the active region 2, and the hard insulating layer 8 may not cover the other sidewalls (the other sidewalls of the active region 2 include the sidewalls the active region 2 between the source region 21 and the drain region 22) of the active region 2 than the sidewalls 20, as shown in FIG. 2f and in FIG. 2g which is a cross-sectional diagram taken along the dashed line C in FIG. 2f. In another implementation, the hard insulating layer 8 may cover the current structure completely, i.e. the hard insulating layer 8 may cover all the sidewalls of the active region 2, the upper surface of the bottom isolating layer 4, the upper surface of the source region 21, the upper surfaces of the drain region 22, and the sidewalls and the upper surface of the gate structure 5, as shown in FIG. 2h and in FIG. 2i which is a cross-sectional diagram taken along the dashed line D in FIG. 2h. By the hard insulating layer 8 covering the current structure completely, moisture generated during subsequent fabrication processes can be prevented from entering the transistor.

Further, the method further includes:

forming a first contact structure connected with the source region and a second contact structure connected with the drain region.

Figure 2I:
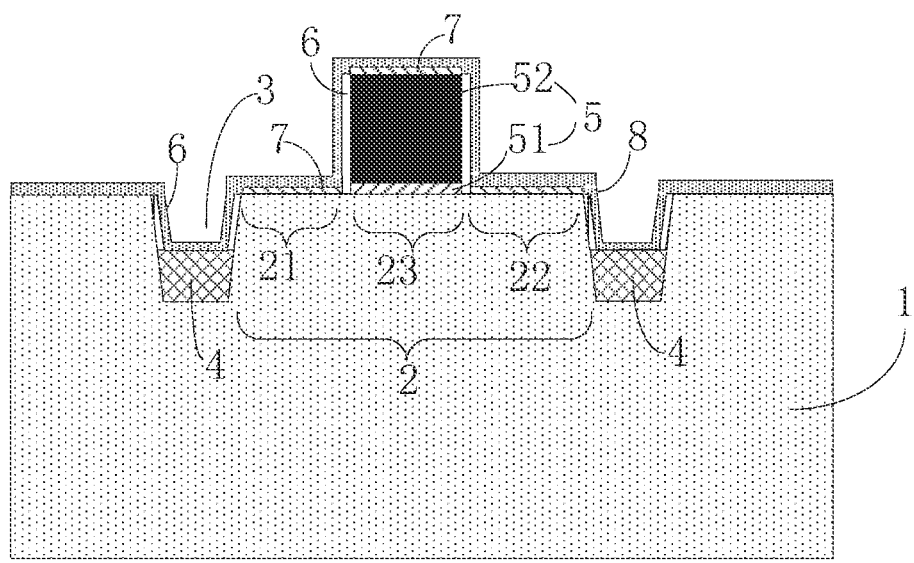
Figure 2J:
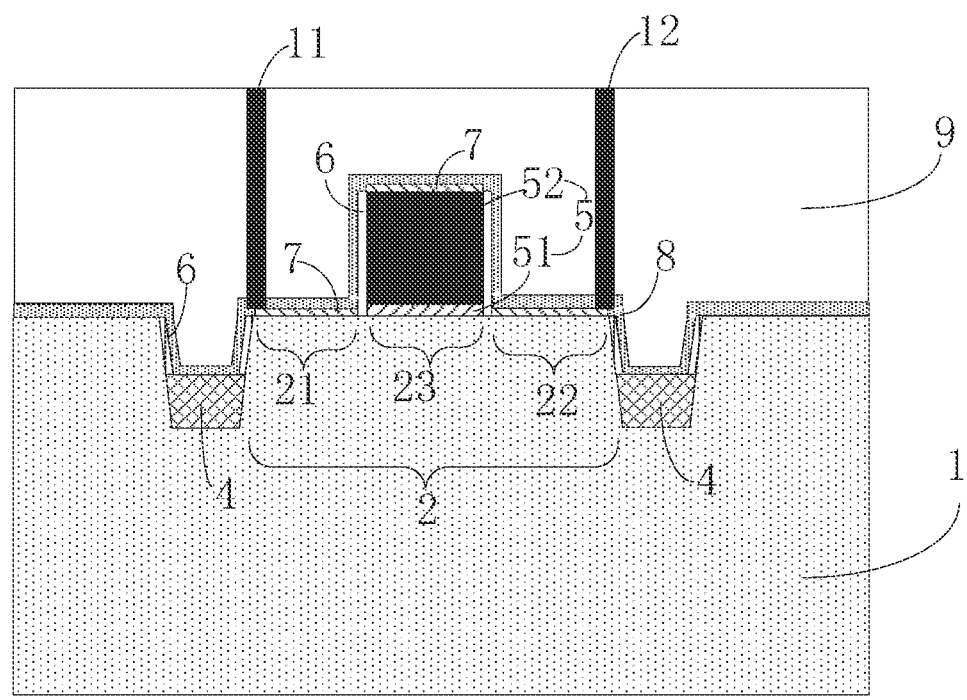

Based on FIG. 2i and as shown in FIG. 2j, after forming the hard insulating layer 8 (the hard insulating layer covers the upper surface of the bottom isolating layer 4, all the sidewalls of the active region 2, the upper surface of the source region 21, the upper surface of the drain region 22 and the sidewalls and the upper surface of the gate structure 5), an insulating layer 9 is formed on the hard insulating layer 8 and filled in the shallow trench isolation trench 3. Then, a first contact structure 11 connected with the upper surface of the source region 21 and a second contact structure 12 connected with the upper surface of the drain region 22 are formed through the insulating layer 9. It is to be noted that when the hard insulating layer 8 also covers the upper surfaces of the source region 21 and the drain region 22, the first contact structure 11 and the second contact structure 12 also penetrate through the hard insulating layer 8 on the source region 21 and the drain region 22 respectively, as shown in FIG. 2j. When the ohmic contact layer 7 is also formed on the upper surfaces of the source region 21 and the drain region 22, the first contact structure 11 is connected with the source region 21 via the ohmic contact layer 7, and the second structure contact 12 is connected with the drain region 21 via the ohmic contact layer 7.

Since the hard insulating layer 8 is on the sidewalls of the active region 2 and covers the source region 21 and the drain region 22, when the first contact structure 11 is somewhat misaligned with the source region 21, i.e., the first contact structure 11 is partially on the source region 21 and partially on the hard insulating layer 8, the first contact structure 11 will not collapse, so that the landing window for the source region 21 is enlarged. Likewise, when the second contact structure 12 is somewhat misaligned with the drain region 22, i.e., the second contact structure 12 is partially on the drain region 22 and partially on the hard insulating layer 8, the second contact structure 12 will not collapse, so that the landing window for the drain region 22 is enlarged.

In the method for fabricating the semiconductor device provided by the embodiment of the present disclosure, the shallow trench isolation trench is first formed in the substrate, the bottom isolating layer is formed in the shallow trench isolation trench, then the gate structure is formed such that the gate structure is on the channel region between the source region and the drain region in the substrate, and then the hard insulating layer is formed on the sidewalls of the active region such that the hard insulating layer covers the source region and the drain region; as a result, subsequently in forming the contact structure, even though the contact structure is partially on the source/drain region and partially on the hard insulating layer, the contact structure will not collapse, so that the landing window for the source region and the drain region is enlarged and the performance of the semiconductor device is improved.

Figure 3:
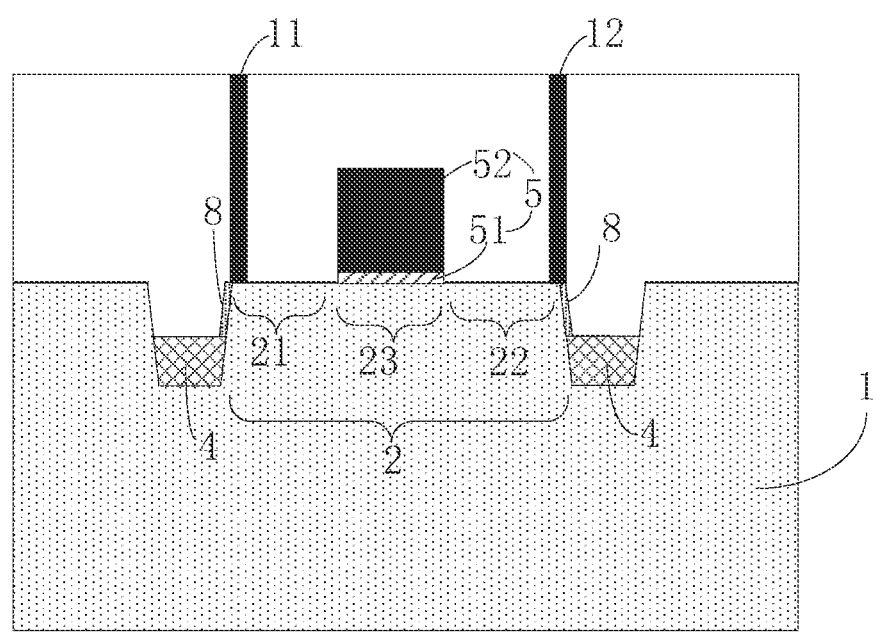
FIG. 3 is a structural diagram of a semiconductor device provided by an embodiment of the present disclosure.

An embodiment of the present disclosure further provides a semiconductor device including a substrate 1, a bottom isolating layer 4, a gate structure 5 and a hard insulating layer 8, as shown in FIG. 3.

Figure 4:
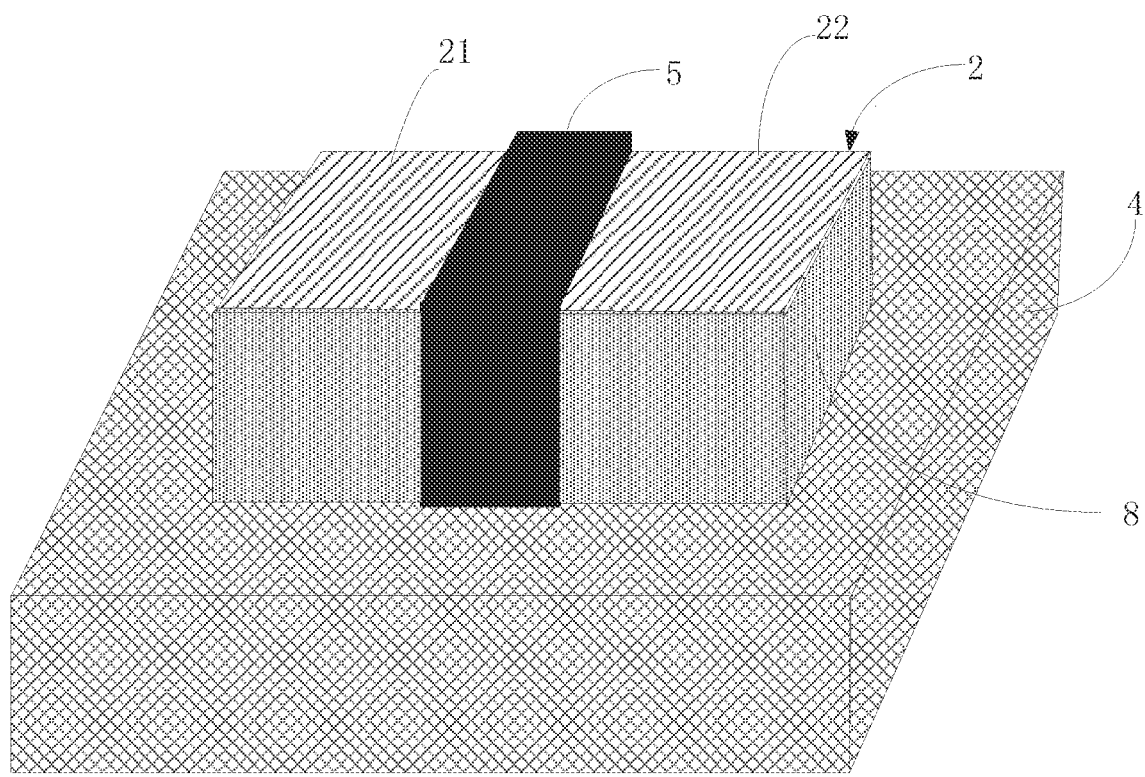
FIG. 4 is a structural diagram of a transistor in a semiconductor device provided by an embodiment of the present disclosure.

The substrate 1 includes an active region 2 which includes a source region 21, a channel region 23 and a drain region 22 that are sequentially connected. With reference to FIG. 4, the bottom isolating layer 4 is located on the bottom periphery of the active region 2, i.e., the isolating layer is disposed to surround the bottom of the active region 2.

The gate structure 5 is on the channel region 23 between the source region 21 and the drain region 22. In some implementations, the gate structure 5 may further extend onto the bottom isolating layer 4 along the sidewalls of the active region 2. The sidewalls of the active region 2 covered by the gate structure 5 may be the sidewalls between the source region 21 and the drain region 22.

Specifically, the gate structure 5 includes a gate insulating layer 51 and a gate layer 52 on the gate insulating layer 51, as shown in FIG. 3. The gate insulating layer 51 is used to isolate the gate layer 52 from the active region 2. The gate insulating layer 51 may be made of silicon oxide or the like, and the gate layer may be made of polysilicon or the like.

Wherein the source region 21 and the drain region 22 in the active region 2 and the gate layer 52 may form a transistor, with the gate layer 52 in the transistor located on the channel region 23 and extending along the sidewalls of the active region 2 to reduce the footprint of the transistor.

As shown in FIG. 4, the hard insulating layer 8 may be on the sidewalls of the active region 2 such that the hard insulating layer 8 at least covers the source region 21 and the drain region 22. The hard insulating layer 8 and the hard mask layer may be made of the same material. For example, the hard insulating layer may be made of silicon nitride (SiN).

As shown in FIG. 3, the semiconductor device further includes a first contact structure 11 connected with the source region 21 and a second contact structure 12 connected with the drain region 22. Since the hard insulating layer 8 is on the sidewalls of the active region 2 and covers the source region 21 and the drain region 22, when the first contact structure 11 is somewhat misaligned with the source region 21, i.e., the first contact structure 11 is partially on the source region 21 and partially on the hard insulating layer 8, the first contact structure 11 will not collapse, so that the landing window for the source region 21 is enlarged. Likewise, when the second contact structure 12 is somewhat misaligned with the drain region 22, i.e., the second contact structure 12 is partially on the drain region 22 and partially on the hard insulating layer 8, the second contact structure 12 will not collapse, so that the landing window for the drain region 22 is enlarged.

The hard insulating layer 8 may cover the source region 21 and the drain region 22 on the sidewalls of the active region 2, or may cover the upper surface of the bottom isolating layer 4, all the sidewalls of the active region 2, the upper surface of the source region 21, the upper surface of the drain region 22 and the sidewalls and the upper surface of the gate layer 5, as shown in FIG. 2j, to prevent the moisture generated during the subsequent fabrication processes from entering the transistor.

As shown in FIG. 2j, the semiconductor device may further include spacers 6 located between the sidewalls of the active region 2 and the hard insulating layer 8 and between the sidewalls of the gate structure 5 and the hard insulating layer 8. The spacers 6 are used to protect the active region 2 and the gate structure 5. The spacers 6 may be an ONO (silicon oxide-silicon nitride-silicon oxide) structure (not shown in the figures).

The semiconductor device may further include an ohmic contact layer 7 located on the upper surface of the source region 21, the upper surface of the drain region 22 and the upper surface of the gate structure 5. When the hard insulating layer 8 extends to the upper surface of the source region 21, the upper surface of the drain region 22 and the upper surface of the gate structure 5, the ohmic contact layer 7 is between the upper surface of the source region 21 and the hard insulating layer 8, between the upper surface of the drain region 22 and the hard insulating layer 8 and between the upper surface of the gate structure 5 and the hard insulating layer 8. Wherein the ohmic contact layer 7 may be made of nickel silicide (NiSi).

The ohmic contact layer 7 is used to reduce contact resistance of the source region 21, the drain region 22 and the gate structure 5 with corresponding contact structure. When the semiconductor device includes the ohmic contact layer 7, the first contact structure 11 penetrates through the hard insulating layer 8 and is connected with the source region 21 via the ohmic contact layer 7, and the second contact structure 12 penetrates through the hard insulating layer 8 and is connected with the drain region 22 via the ohmic contact layer 7.

The ohmic contact layer 7 forms ohmic contacts with the source region 21, the drain region 22 and the gate structure 5, so that the voltage drops at the positions of the contacts will be small enough to reduce their influences on the electrical performance of the device when the source region 21, the drain region 22, and the gate structure 5 are applied with voltages.

In the semiconductor device provided by the embodiment of the present disclosure, the shallow trench isolation trench is first formed in the substrate, the bottom isolating layer is formed in the shallow trench isolation trench, then the gate structure is formed such that the gate structure is on the channel region between the source region and the drain region in the substrate, and then the hard insulating layer is formed on the sidewalls of the active region such that the hard insulating layer covers the source region and the drain region; as a result, subsequently in forming the contact structure, even though the contact structure is partially on the source/drain region and partially on the hard insulating layer, the contact structure will not collapse, so that the landing window for the source region and the drain region is enlarged and the performance of the semiconductor device is improved.

Figure 5:
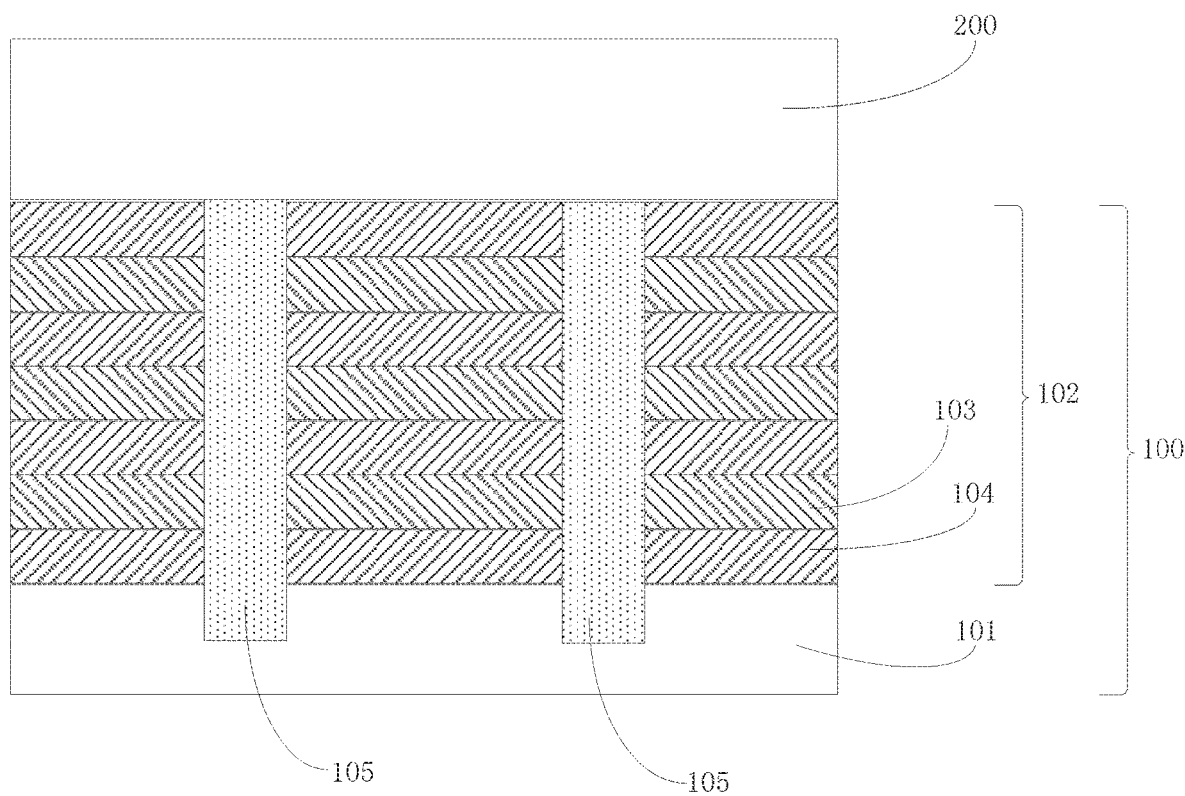
FIG. 5 is structural diagram of a three-dimensional memory provided by an embodiment of the present disclosure.

Refer to FIG. 5, which is a structural diagram of a three-dimensional memory provided in an embodiment of the present disclosure.

As shown in FIG. 5, the three-dimensional memory includes a memory array structure 100 and a peripheral structure 200. Wherein the memory array structure 100 may be a non-volatile memory array structure. For example, the memory array structure 100 may be an NAND flash, an NOR flash, or the like.

Specifically, the memory array structure 100 may include a substrate 101 and a stack 102 on the substrate 101, the stack 102 including a plurality of gate layers 103 and interlayer insulating layers 104 stacked longitudinally and alternately. Wherein "longitudinally" means the direction perpendicular to the upper surface of the substrate 101. The number of the stacked layers of the gate layers 103 and the interlayer insulating layers 104 is not limited and may be, for example, 48, 64 etc. The memory array structure 100 may further include memory channel structures 105 extending longitudinally through the stack 102 and into the substrate 101. The memory channel structure 105 may include a channel layer (not shown in the figure) extending longitudinally and a memory medium layer (not shown in the figure) disposed to surround periphery of the channel layer.

The peripheral structure 200 may include a complementary metal oxide semiconductor (CMOS), a static random access memory (SRAM), a dynamic random access memory (DRAM), a field programmable gate array (FPGA), a central processing unit (CPU), a Xpoint chip, or any other devices.

Specifically, the peripheral structure 200 may be located on and connected with the memory array structure 100. The peripheral structure 200 may include semiconductor devices in the embodiments described above, whose details will not be repeated here.

The memory array structure 100 and the peripheral structure 200 may also take any other suitable architecture forms, which are not limited herein. For example, the peripheral structure 200 is located below the memory array structure 100, i.e., the periphery under core array (PUC) architecture. AS another example, the peripheral structure 200 and the memory array structure 100 are arranged in parallel, i.e., a periphery near core array (PNC) architecture.

In the three-dimensional memory provided by the embodiment of the present disclosure, the shallow trench isolation trench is first formed in the substrate, the bottom isolating layer is formed in the shallow trench isolation trench, then the gate structure is formed such that the gate structure is on the channel region between the source region and the drain region in the substrate, and then the hard insulating layer is formed on the sidewalls of the active region such that the hard insulating layer covers the source region and the drain region; as a result, subsequently in forming the contact structure, even though the contact structure is partially on the source/drain region and partially on the hard insulating layer, the contact structure will not collapse, so that the landing window for the source region and the drain region is enlarged and the performance of the three-dimensional memory is improved.

In summary, the present disclosure has disclosed the preferred embodiments above, however the preferred embodiments above are not used to limit the present disclosure. Various changes and modifications may be made by those of ordinary skills in the art without departing from the spirit and scope of the present disclosure. Accordingly, the present disclosure has its scope only defined by the following claims.

What is claimed is:

1. A method for fabricating a semiconductor device, comprising:
    forming a shallow trench isolation trench in a substrate, wherein the substrate comprises an active region, the shallow trench isolation trench is on a periphery of the active region, and the active region comprises a source region, a channel region, and a drain region;
    forming a bottom isolating layer in a bottom portion of the shallow trench isolation trench;
    forming a gate structure on the channel region, comprising:
        forming a gate insulating layer on an inner surface of the shallow trench isolation trench and on the substrate;
        forming a gate layer on the gate insulating layer; and
        partially etching the gate insulating layer and the gate layer, such that remaining portions of the gate insulating layer and the gate layer on the channel region form the gate structure;
    forming spacers having an ONO structure on sidewalls of the shallow trench isolation trench and sidewalls of the gate structure; and
    forming a hard insulating layer in an upper portion of the shallow trench isolation trench and on sidewalls of the active region, such that the hard insulating layer covers the source region and the drain region.

2. The method of claim 1, wherein forming the bottom isolating layer comprises:
    forming a dielectric layer in the shallow trench isolation trench; and
    partially etching the dielectric layer, such that a remaining portion of the dielectric layer forms the bottom isolating layer.

3. The method of claim 1, wherein forming the hard insulating layer comprises:
    forming the hard insulating layer extending onto the bottom isolating layer, the source region, the drain region, and the gate structure.

4. The method of claim 1, further comprising:
before forming the hard insulating layer, forming an ohmic contact layer on the source region, the drain region, and the gate structure.

5. The method of claim 1, further comprising:
forming a first contact structure connected with the source region and a second contact structure connected with the drain region.

6. A semiconductor device, comprising:
an active region comprising a source region, a channel region, and a drain region that are sequentially connected;
a bottom isolating layer covering a lower portion of sidewalls of the active region;
a gate structure on the channel region and extending onto the bottom isolating layer along the sidewalls of the active region;
a hard insulating layer covering an upper portion of sidewalls of the source region and the drain region; and
spacers having an ONO structure located between the hard insulating layer and the sidewalls of the active region and on sidewalls of the gate structure.

7. The semiconductor device of claim 6, wherein the gate structure comprises a gate insulating layer and a gate layer on the gate insulating layer.

8. The semiconductor device of claim 6, wherein the hard insulating layer is further located on the bottom isolating layer, the source region, the drain region and the gate structure.

9. The semiconductor device of claim 8, further comprising:
an ohmic contact layer located between the source region and the hard insulating layer, between the drain region and the hard insulating layer, and between the gate structure and the hard insulating layer.

10. The semiconductor device of claim 6, further comprising:
a first contact structure connected with the source region and a second contact structure connected with the drain region.

11. A three-dimensional memory, comprising:
a memory array structure and a peripheral structure connected with the memory array structure, wherein the peripheral structure comprises a semiconductor device, the semiconductor device comprising:
an active region comprising a source region, a channel region and a drain region that are sequentially connected;
a bottom isolating layer covering a lower portion of sidewalls of the active region;
a gate structure on the channel region and extending onto the bottom isolating layer along the sidewalls of the active region;
a hard insulating layer covering an upper portion of sidewalls of the source region and the drain region; and
spacers having an ONO structure located between the hard insulating layer and the sidewalls of the active region and on sidewalls of the gate structure.

12. The three-dimensional memory of claim 11, wherein the hard insulating layer is further located on the bottom isolating layer, the source region, the drain region and the gate structure.

13. The three-dimensional memory of claim 12, wherein the semiconductor device further comprises:
an ohmic contact layer located between the source region and the hard insulating layer, between the drain region and the hard insulating layer, and between the gate structure and the hard insulating layer.

14. The three-dimensional memory of claim 11, wherein the semiconductor device further comprises:
a first contact structure connected with the source region and a second contact structure connected with the drain region.

15. The method of claim 1, wherein:
forming the hard insulating layer including forming the hard insulating layer to simultaneously cover sidewalls of the spacers and top surfaces of the bottom isolating layer.

16. The semiconductor device of claim 6, wherein:
the hard insulating layer simultaneously covers sidewalls of the spacers and top surfaces of the bottom isolating layer.

17. The three-dimensional memory of claim 11, wherein:
the hard insulating layer simultaneously covers sidewalls of the spacers and top surfaces of the bottom isolating layer.

* * * * *